(12) United States Patent  
Baselmans et al.

(10) Patent No.: US 7,304,718 B2
(45) Date of Patent: Dec. 4, 2007

(54) LITHOGRAPHIC APPARATUS AND DEVICE MANUFACTURING METHOD

(75) Inventors: Johannes Jacobus Matheus Baselmans, Oirschot (NL); Arno Jan Bleeker, Westerhoven (NL); Pieter Willem Herman De Jager, Rotterdam (NL); Kars Zeger Troost, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 8 days.

(21) Appl. No.: 10/919,530

(22) Filed: Aug. 17, 2004

(65) Prior Publication Data

US 2006/0038969 A1   Feb. 23, 2006

(51) Int. Cl.
  G03B 27/42   (2006.01)
  G03B 27/54   (2006.01)
(52) U.S. Cl. .......................................... 355/53; 355/67
(58) Field of Classification Search ................. 355/53, 355/67, 77, 55; 359/291–292; 245/85
  See application file for complete search history.

(56) References Cited

U.S. PATENT DOCUMENTS

| 5,229,872 A | 7/1993 | Mumola |
| 5,296,891 A | 3/1994 | Vogt et al. |
| 5,311,360 A | 5/1994 | Bloom et al. |
| 5,500,736 A | 3/1996 | Koitabashi et al. |
| 5,523,193 A | 6/1996 | Nelson |
| 5,530,482 A | 6/1996 | Gove et al. |
| 5,579,147 A | 11/1996 | Mori et al. |
| 5,677,703 A | 10/1997 | Bhuva et al. |
| 5,808,797 A | 9/1998 | Bloom et al. |
| 5,841,579 A | 11/1998 | Bloom et al. |
| 5,982,553 A | 11/1999 | Bloom et al. |
| 6,133,986 A | 10/2000 | Johnson |
| 6,177,980 B1 | 1/2001 | Johnson |
| 6,232,936 B1* | 5/2001 | Gove et al. .................... 345/85 |
| 6,687,041 B1 | 2/2004 | Sandstrom |
| 6,747,783 B1 | 6/2004 | Sandstrom |
| 6,795,169 B2 | 9/2004 | Tanaka et al. |
| 6,806,897 B2 | 10/2004 | Kataoka et al. |
| 6,811,953 B2 | 11/2004 | Hatada et al. |
| 6,833,854 B1 | 12/2004 | Sandström |
| 2002/0122237 A1* | 9/2002 | Sandstrom et al. ......... 359/291 |
| 2004/0041104 A1 | 3/2004 | Liebregts et al. |
| 2004/0130561 A1 | 7/2004 | Jain |
| 2005/0007572 A1 | 1/2005 | George et al. |
| 2005/0088640 A1* | 4/2005 | Eib et al. ...................... 355/77 |

FOREIGN PATENT DOCUMENTS

| WO | WO 98/33096 | 7/1998 |
| WO | WO 98/38597 | 9/1998 |

OTHER PUBLICATIONS

European Search Report, dated Jan. 26, 2006, for European Patent Appl. No. 05254919.3, 4 pages.

* cited by examiner

*Primary Examiner*—Henry Hung Nguyen
(74) *Attorney, Agent, or Firm*—Sterne, Kessler, Goldstein & Fox P.L.L.C.

(57) ABSTRACT

An array of individually controllable elements, comprising a plurality of control areas consisting of a plurality of rows of reflectors. Alternate rows of reflectors are actuated in a common manner such that the control areas function as a grating to provide a control element that can be used as a diffractive optical element.

17 Claims, 5 Drawing Sheets

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, may be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation sensitive material (e.g., resist). Instead of a mask, the patterning means may comprise an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the beam in a given direction (the "scanning" direction), while synchronously scanning the substrate parallel or anti-parallel to this direction.

It has been proposed to use as an array of individually controllable elements to pattern a beam of radiation a matrix addressable surface having a viscoelastic (e.g., having viscous as well as elastic properties) control layer and a reflective surface. When the viscoelastic control layer is addressed, its surface deforms to form, for example, a sinusoid. The basic principle behind such an apparatus is that addressed areas of the reflective surface reflect incident light as diffracted light because the sinusoidal shape of the reflective surface acts as a grating, whereas unaddressed areas reflect incident light as undiffracted light. Using an appropriate spatial filter, the undiffracted light can be filtered out of the reflected beam, leaving only the diffracted light to reach the substrate. In this manner the beam becomes patterned according to the addressing pattern of the matrix addressable surface.

A corresponding device has also been proposed using an array of diffractive optical MEMS devices. Each diffractive optical MEMS device is comprised of a plurality of reflective ribbons that can be deformed relative to one another to form a grating that reflects incident light as diffracted light.

However, arrangements for the array of individually controllable elements as discussed above are difficult to manufacture. In particular, the formation of the control circuitry below the reflective surfaces imposes constraints on the order of the processing steps during manufacture. Furthermore, the individual elements typically require a significant amount of space around them. This is especially true for diffractive optical MEMS devices. For example, this can be done to provide the drive electronics. This prevents dense packing of the individually controllable elements.

A further alternative used as the array of individually controllable elements is a matrix arrangement of small mirrors. The mirrors are matrix addressable, such that each mirror can be independently controlled to reflect incoming radiation in a desired direction. Only radiation reflected in a given direction is projected onto the substrate (i.e., which enters the pupil of the projection system). Accordingly, by appropriate addressing of the individual mirrors, the radiation beam can be patterned as required. However, it is difficult to execute in practice because the position of each mirror must be very precisely controlled.

Thus, what is needed is a system and method for use in a lithographic apparatus with an improved array of individually controllable elements.

SUMMARY OF THE INVENTION

According to an embodiment of the present invention, there is provided a lithographic apparatus comprising an illumination system for supplying a beam of radiation, an array of reflectors serving to modulate the beam with a pattern. Each reflector has an associated actuator that can position the reflector. The array of reflectors has a plurality of control areas that each comprise at least three adjacent rows of reflectors. A controller is configured to provide control signals to the actuators such that alternate rows of reflectors in each control area are set to a first common position. The remaining rows are set to a second common position. A substrate table supports a substrate. A projection system projects the radiation reflected from the array of reflectors onto a target portion of the substrate.

According to another embodiment of the present invention, there is provided an array of reflectors configured to modulate a beam of radiation in a lithographic apparatus, comprising a plurality of actuators arranged to position reflectors and a controller that provides control signals to the actuators. The array has a plurality of control areas that each comprise at least three adjacent rows of reflectors. The controller can be configured to provide control signals to the actuators associated with reflectors in control areas, such that alternate rows of reflectors in each control area are set to a first common position and the remaining rows of reflectors are set to a second common position.

According to a further embodiment of the present invention, there is provided a device manufacturing method comprising the following steps. Providing a substrate. Providing a beam of radiation using an illumination system. Using an array of reflectors, that includes a plurality of control areas that each comprise at least three adjacent rows of reflectors. The array of reflectors modulate the beam with a pattern. Each reflector is positioned by an associated actuator. Providing control signals to the actuators. Alternate rows of reflectors in each control area are set to a first common position. The remaining rows of reflectors are set to a second common position. Projecting the radiation reflected from the array of reflectors onto a target portion of the substrate.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers may indicate identical or functionally similar elements.

DETAILED DESCRIPTION OF THE EMBODIMENTS

Overview and Terminology

Although specific reference may be made in this text to the use of lithographic apparatus in the manufacture of integrated circuits (ICs), it should be understood that the lithographic apparatus described herein may have other applications, such as the manufacture of integrated optical systems, guidance and detection patterns for magnetic domain memories, flat panel displays, thin film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (e.g., a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multilayer IC, so that the term substrate used herein may also refer to a substrate that already contains multiple processed layers.

The term "array of individually controllable elements" or "array of reflectors" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array may comprise a matrix addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix addressable surface.

It will be appreciated that, as an alternative, the filter may filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix addressable, such that addressed mirrors will reflect an incoming radiation beam in a different direction to unaddressed mirrors; in this manner, the reflected beam is patterned according to the addressing pattern of the matrix addressable mirrors. The required matrix addressing can be performed using suitable electronic means.

In both of the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where prebiasing of features, optical proximity correction features, phase variation techniques and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multilayer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultraviolet (EUV) radiation (e.g., having a wavelength in the range of 520 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the beam of radiation, and such components may also be referred to below, collectively or singularly, as a "lens."

The lithographic apparatus may be of a type having two (e.g., dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index (e.g., water), so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Further, the apparatus may be provided with a fluid processing cell to allow interactions between a fluid and irradiated parts of the substrate (e.g., to selectively attach chemicals to the substrate or to selectively modify the surface structure of the substrate).

Lithographic Projection Apparatus

Figure 1:
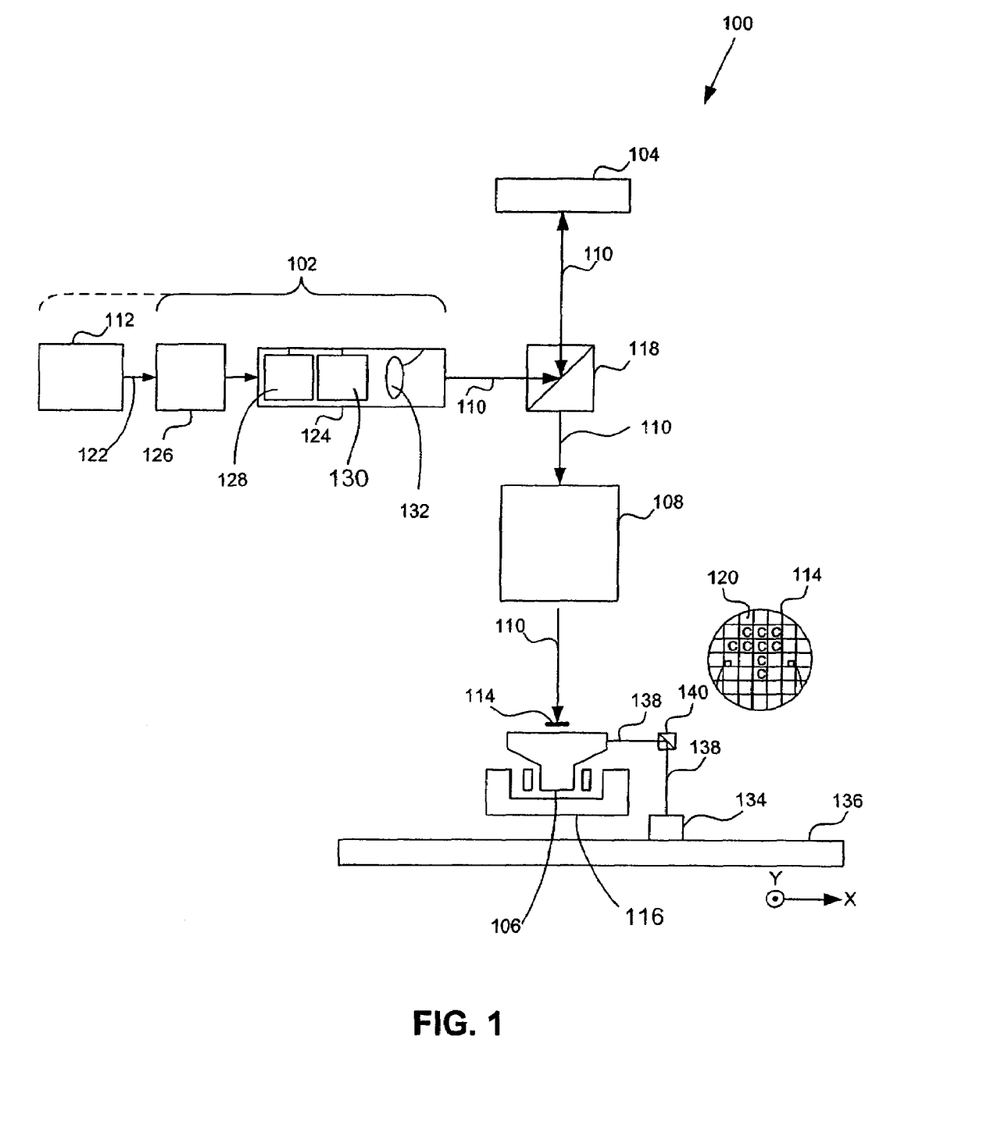
FIG. 1 depicts a lithographic apparatus, according to one embodiment of the invention.

FIG. 1 schematically depicts a lithographic projection apparatus 100 according to an embodiment of the invention. Apparatus 100 includes at least a radiation system 102, an array of individually controllable elements 104, an object table 106 (e.g., a substrate table), and a projection system ("lens") 108.

Radiation system 102 can be used for supplying a beam 110 of radiation (e.g., UV radiation), which in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 may be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for accurately positioning substrate 114 with respect to projection system 108.

Projection system 108 (e.g., a quartz and/or CaF2 lens system or a catadioptric system comprising lens elements made from such materials, or a mirror system) can be used for projecting the patterned beam received from a beam splitter 118 onto a target portion 120 (e.g., one or more dies) of substrate 114. Projection system 108 may project an image of the array of individually controllable elements 104 onto substrate 114. Alternatively, projection system 108 may project images of secondary sources for which the elements of the array of individually controllable elements 104 act as shutters. Projection system 108 may also comprise a micro lens array (MLA) to form the secondary sources and to project microspots onto substrate 114.

Source 112 (e.g., an excimer laser) can produce a beam of radiation 122. Beam 122 is fed into an illumination system (illuminator) 124, either directly or after having traversed conditioning device 126, such as a beam expander 126, for example. Illuminator 124 may comprise an adjusting device 128 for setting the outer and/or inner radial extent (commonly referred to as σ-outer and σ-inner, respectively) of the intensity distribution in beam 122. In addition, illuminator 124 will generally include various other components, such as an integrator 130 and a condenser 132. In this way, beam 110 impinging on the array of individually controllable elements 104 has a desired uniformity and intensity distribution in its cross section.

It should be noted, with regard to FIG. 1, that source 112 may be within the housing of lithographic projection apparatus 100 (as is often the case when source 112 is a mercury lamp, for example). In alternative embodiments, source 112 may also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

Beam 110 subsequently intercepts the array of individually controllable elements 104 after being directing using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 106 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long stroke module (course positioning) and a short stroke module (fine positioning), which are not explicitly depicted in FIG. 1. A similar system may also be used to position the array of individually controllable elements 104. It will be appreciated that beam 110 may alternatively/additionally be moveable, while object table 106 and/or the array of individually controllable elements 104 may have a fixed position to provide the required relative movement.

In an alternative configuration of the embodiment, substrate table 106 may be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 110. Alternatively, substrate 114 may be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 maybe used to project a patterned beam 110 for use in resistless lithography.

The depicted apparatus 100 can be used in four preferred modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, the array of individually controllable elements 104 is movable in a given direction (the so called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned beam 110 scans across substrate 114 and exposes it.

Combinations and/or variations on the above described modes of use or entirely different modes of use may also be employed.

In the embodiment shown in FIG. 1, array of individually controllable elements 104 is a programmable mirror array. Programmable mirror array 104, comprises a matrix arrangement of tiny mirrors, each of which can be individually tilted about an axis. The degree of tilt defines the state of each mirror. The mirrors are controllable, when the element is not defective, by appropriate control signals from the controller. Each non-defective element is controllable to adopt any one of a series of states, so as to adjust the intensity of its corresponding pixel in the projected radiation pattern.

In one example, the series of states includes: (a) a black state in which radiation reflected by the mirror makes a minimum, or even a zero contribution to the intensity distribution of its corresponding pixel; (b) a whitest state in which the reflected radiation makes a maximum contribution; and (c) a plurality of states in between in which the reflected radiation makes intermediate contributions. The states are divided into a normal set, used for normal beam patterning/printing, and a compensation set, used for compensating for the effects of defective elements. The normal set comprises the black state and a first group of the intermediate states. This first group will be described as grey states, and they are selectable to provide progressively increasing contributions to corresponding pixel intensity from the minimum black value up to a certain normal maximum. The compensation set comprises the remaining, second group of intermediate states together with the whitest state. This second group of intermediate states will be described as white states, and they are selectable to provide contributions greater than the normal maximum, progressively increasing up to the true maximum corresponding to the whitest state. Although the second group of intermediate states are being described as white states, it will be appreciated that this is simply to facilitate the distinction between the normal and compensatory exposure steps. The entire plurality of states could alternatively be described as a sequence of grey states, between black and white, selectable to enable grayscale printing.

Exemplary Array of Individually Controllable Elements

Figure 2A:
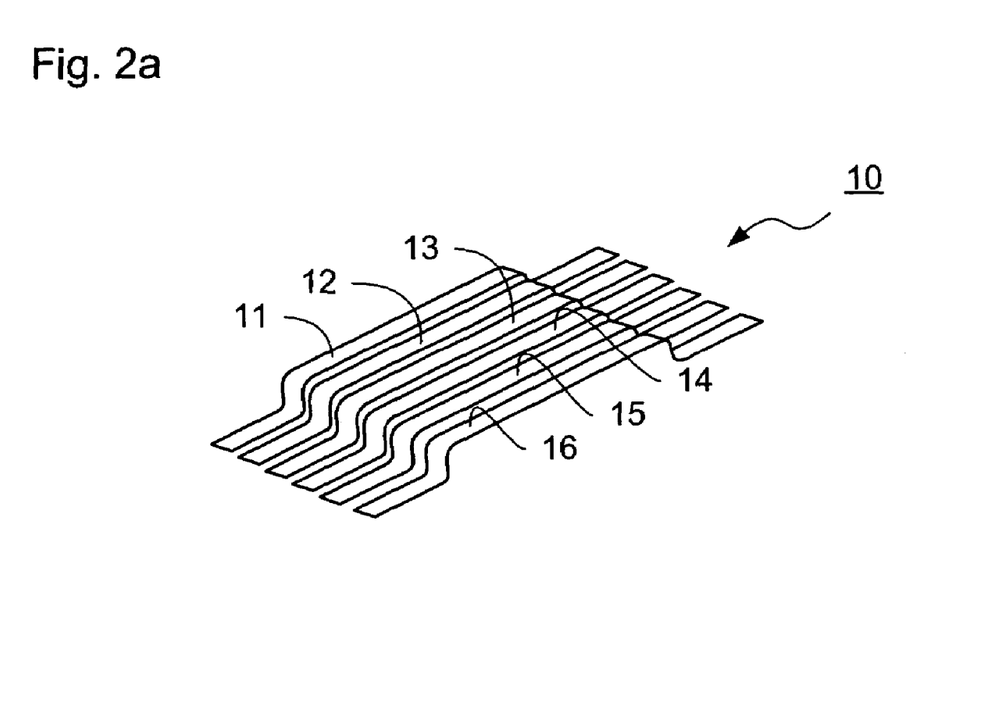
FIGS. 2a and 2b illustrate the operation of a diffractive optical MEMS device used in an array of individually controllable elements in a lithographic apparatus.
Figure 2B:
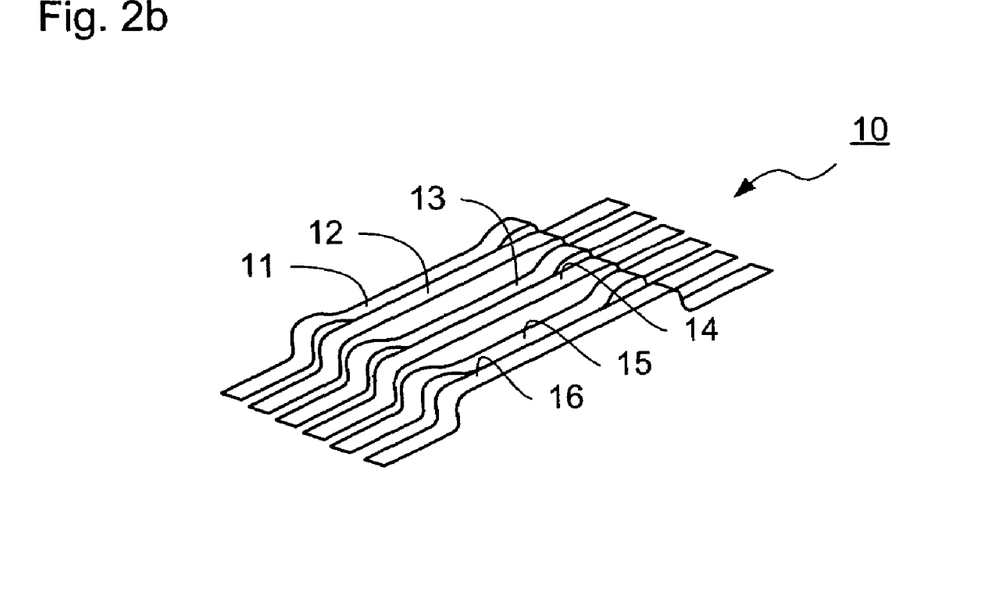

FIGS. 2a and 2b illustrate the operation of a diffractive optical MEMS device used in an array of individually controllable elements in a lithographic apparatus. In FIGS. 2a and 2b, a diffractive optical MEMS device 10 is made of a series of parallel reflective ribbons 11,12,13,14,15, and 16. The device can be switched between two states. In a first state, as shown in FIG. 2a, all of the reflective ribbons lie within the same plane and the device acts as a plane reflector, reflecting undiffracted light. In a second state, shown in FIG. 2b, alternate ribbons 11,13,15 are displaced such that those reflective ribbons 11,13,15 lie in a different plane to that is parallel to the plane in which the undisplaced reflective ribbons 12,14,16 remain. The diffractive optical MEMS device 10 in the second state functions as a grating, reflecting diffracted light.

Second Exemplary Array of Individually Controllable Elements

FIGS. 3a to 3f illustrate alternative positions of reflectors in an array of individually controllable elements, according to one embodiment of the present invention.

Figure 3A:
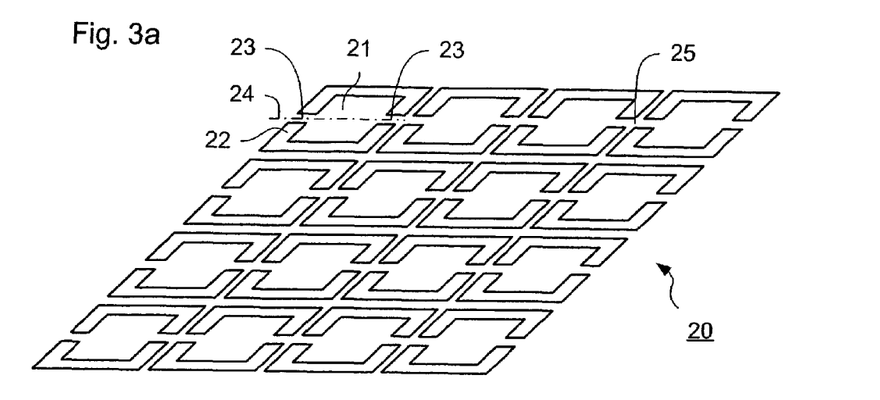
FIGS. 3a to 3f illustrate alternative positions of reflectors in an array of individually controllable elements, according to one embodiment of the present invention.

The control element of the present invention for use in an array of individually controllable elements is comprised of a plurality of reflectors 21 that may be actuated. For example, as shown in FIG. 3a, reflectors 21 may be mounted on hinges 23 above openings 22 on a substrate (not shown). Each reflector is associated with an actuator (not shown) for changing its position. For example, in the arrangement shown in FIG. 3a, the actuators apply a force to reflector 21 in order to rotate it about a tilt axis 24. In one example, reflectors 21, hinges 23, and support sections 25, which are mounted on the substrate between the openings 22 in the substrate, are made from a single layer of metal. For example, from aluminum.

The array of reflectors includes a large number of reflectors 21. For example, the arrays can include about 500×2000 reflectors 21, about 2000×5000 reflectors 21, or larger.

In one example, the arrays of reflectors are divided into control areas of, for example, four rows of reflectors 21, each comprising four reflectors 21. The embodiment shown in FIGS. 3a to 3f represent such a control area 20. Each control area functions as an individually controllable element. Specifically, each control area may function as a shutter for a secondary source in lithographic apparatus using a projection system that images secondary sources onto the substrate, as described above, or may be used to generate a pixel in lithographic apparatus in which the projection system images the array of reflectors onto the substrate.

Figure 3B:
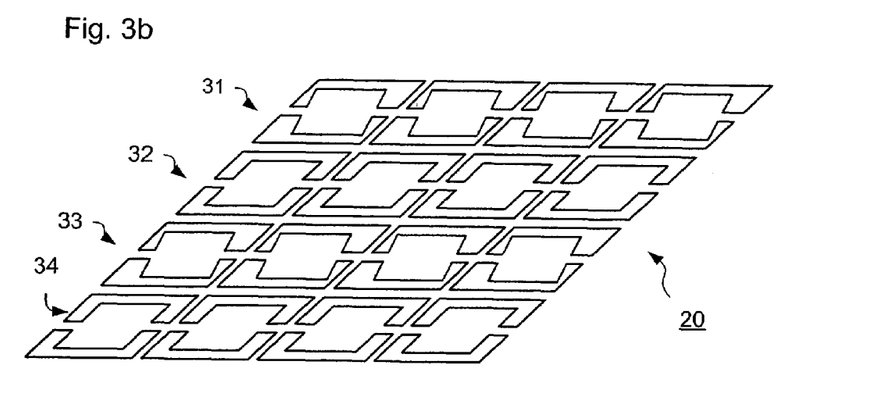

Reflectors 21 in control area 20 are arranged in parallel, adjacent, rows 31,32,33,34. Reflectors 21 in any given row are actuated in a common fashion. In this way, each control area 20 can be made to function as a diffractive element. In a first position, as shown in FIG. 3a, none of reflectors 21 are actuated and control area 20 substantially functions as a planar reflector, reflecting undiffracted radiation. In a second position, as shown in FIG. 3b, alternate rows 31,33 of reflectors 21 are actuated. In this position, control area 20 functions as a grating and reflects diffracted radiation. For example, consider radiation that is reflected in a particular direction when control area 20 is in the first position. Once the alternate rows 31,33 of reflectors 21 have been actuated, only the remaining rows 32,34, which are separated by an intervening row 33, reflect radiation in the same direction as before. Accordingly, these rows function as a grating and diffracted radiation is reflected.

Such an array of individually controllable elements comprising an array of reflectors 21 divided into control areas similar to control area 20 that are individually controllable to function as a controllable grating can exhibit desirable characteristics. For example, control area 20 can be densely packed because in this example there is no requirement for any separation between the individual reflectors in the array and hence no requirement for any separation between control area 20. In contrast to conventional MEMs devices, such dense packing is not typically available, which can result in loss of contrast due to radiation being incident on non-active areas of the array of individually controllable elements. As another example, the manufacture of arrays of reflectors can be significantly simpler than the known diffractive optical MEMS devices.

In this embodiment, a controller (not shown) is used to drive the array of reflectors, namely to provide control signals to set control area 20 in the appropriate positions. This is in contrast to conventional arrays of reflectors, in which each individual reflector may be set to the required position independently of all other reflectors. Accordingly, in conventional systems the associated control system is complicated and a large number of control lines are required to provide the control signals to the array of reflectors and within the array of reflectors to each actuator associated with the individual reflectors.

In one example, a controller of reduced complexity for driving the array of reflectors may be used. In particular, the controller only needs to generate a control signal for each control area 20 as a whole, rather than control signals for each individual reflector 21 within it. For, as discussed below, independent control may be provided for each row in control area 20 or for alternate rows (i.e., alternate rows in control area 20 may receive a first control signal and the remainder of the rows in control area 20 receive a second signal).

In one example, the array of reflectors has a controller that can be switched between two operating modes: a first mode, in which control areas of reflectors are collectively controlled to function as controllable gratings; and a second mode, in which each of the individual reflectors can be independently controlled. Accordingly, such an array of reflectors can be used in lithographic apparatus adapted for using the first control mode or in apparatus adapted for using the second control mode. It can also be used in a lithographic apparatus that can switch between the two operating modes.

Each of reflectors 21 may have an independent actuator. In this case the array of reflectors may have a single control line for each control signal applied to a control area that is connected to each of the relevant actuators, thereby providing the same signal to each actuator. It is to be appreciated that this does not necessarily mean that a dedicated control line is provided for each control area 20. Arrays of individually controllable elements can use matrix addressing, in which a plurality of individually controllable elements share a common control line within the array, but are addressed at different times. A similar approach maybe used for addressing control area 20, the alternate rows of reflectors 21 in a control area or the individual rows of reflectors 21 in a control area 20.

Although each reflector 21 in a control area 20 may have an independent actuator, this is not necessary. For example, each row of reflectors 21 may have a single actuator or each of the actuators associated with reflectors 21 in a single row may share a common component. Likewise, the alternate rows of reflectors 21 within a given control area 20 may share a common actuator or have actuators that share a common component.

In one example, capacitive actuators may be used to position reflectors 21. In such an arrangement, a voltage is applied between a conductor (not shown) arranged on a substrate (not shown) of the array of reflectors and another conductor (not shown) that moves with reflector 21. The latter conductor may be connected to reflector 21 or, may be the reflector itself. As the voltage is applied, the conductors attract, actuating reflector 21. The conductors arranged on the substrate may be common for all of reflectors 21 within a row in a control area 20 or for alternate rows of reflectors 21 within a control area 20, thereby providing a common element for each of the actuators associated with reflectors 21.

It is to be appreciated that the present invention is not limited to a particular actuation system for reflectors 21. In particular, actuators other than capacitive actuators may also by used, for example piezoelectric actuators. Others will become apparent to one of ordinary skill in the art based on teachings herein.

Figure 3C:
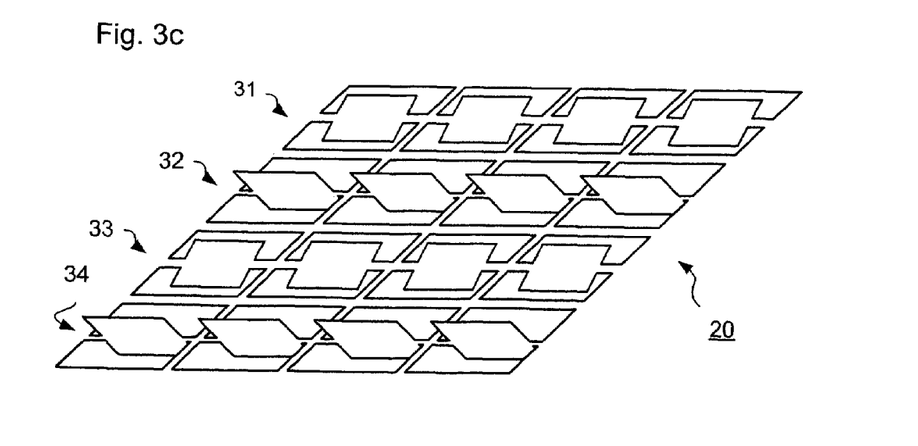

As discussed above in relation to FIG. 3b, control area 20 may be set to its second state by actuating alternate rows of reflectors 21. However, control area 20 may also be set to reflect diffracted radiation by actuating all of reflectors 21, but actuating alternate reflectors 21 in opposite senses, as shown in FIG. 3c. The advantage of such an arrangement over that shown in FIG. 3b is that the intensity distribution of the diffracted radiation is symmetric, reducing the sensitivity to focus errors.

In one example, in addition to the positions shown in FIGS. 3b and 3c, control area 20 may function as a grating when all of the rows of reflectors are actuated in the same direction because each reflector has a component of the reflector that is raised and a component of the reflector that is lowered. Accordingly, control area 20 functions as a phase grating. Such an arrangement is simpler for providing the necessary control signals but it is less effective as a grating.

In one example, control area 20 is set to actuate alternate rows of reflectors in opposite directions, as shown in FIG. 3c, by providing independent control signals to each of the rows of reflectors 21 or by providing a common control signal to alternate rows of reflectors 21.

In one example, control area 20 is set to actuate alternate rows of reflectors 21 in opposite directions by providing a common control signal to all of reflectors 21 in control area 20. This maybe achieved by arranging the actuators for reflectors 21 such that, when a common control signal is applied to all of the actuators for a given control area, the actuators associated with alternate rows of reflectors 21 actuate reflectors 21 in a first direction and the actuators associated with the remaining reflectors 21 actuate those reflectors 21 in the opposite direction. For example, in the arrangement shown in FIG. 3c, reflectors 21 rotate about respective tilt axes that are parallel to one another.

One application of the common control signal, reflectors 21 in alternate rows 31,33 rotate about the tilt axis in a first direction and reflectors 21 in the remaining rows 32,34 rotate about the tilt axis in the opposite direction.

In one example, in the arrangement shown in FIGS. 3b and 3c, the rows 31,32,33,34 of reflectors 21 that are actuated in the same manner are arranged parallel to tilt axis 24 of the individual reflectors 21.

Figure 3D:
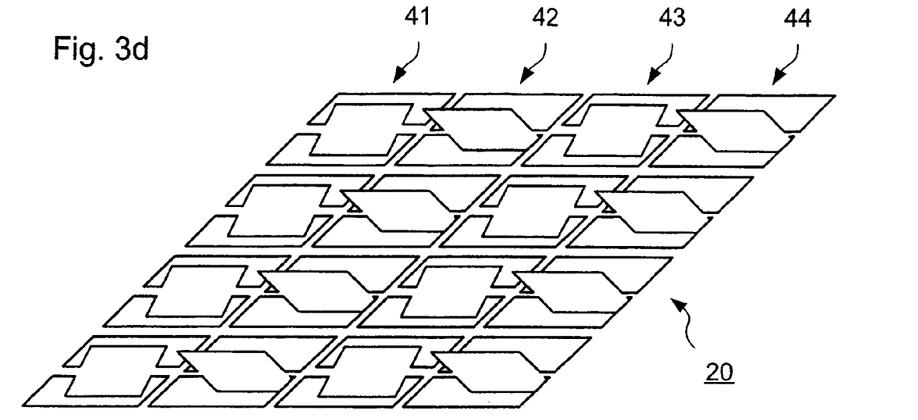

In one example, as shown in FIG. 3d, control area 20 is arranged such that the rows 41,42,43,44 of reflectors 21 that are actuated in a common fashion are arranged in a direction perpendicular to tilt axis 24 of reflectors 21 in control area 20. In such an arrangement it is merely necessary to actuate alternate rows of reflectors 21. However, by actuating all of reflectors 21, but actuating alternate rows of reflectors 21 in a first direction and the remainder in an opposite direction, as shown in FIG. 3d, the diffracted radiation is scattered symmetrically. Furthermore, such an arrangement forms a two dimensional grating, in contrast to the arrangements of FIGS. 3b and 3c which are only one dimensional. Additionally, the grating period of the arrangement shown in FIG. 3d is half that of the arrangements shown in FIGS. 3b and 3c, i.e., it is the size of an individual reflector 21. Reducing the size of the grating period is increases the diffraction angle of the grating, i.e., increasing the separation between the zero order and first order radiation. Accordingly, it is easier, for example, to ensure that only one of the zero and first order radiation is directed to the substrate.

In the arrangement of the arrays of reflectors as shown in FIGS. 3a to 3d, reflectors 21 are substantially square in shape and are provided with hinges 23 substantially midway between opposite sides of reflectors 21, such that the tilt axis 24 of reflectors 21 passes substantially midway through reflector 21 and is parallel to the remaining two sides.

It is to be appreciated, however, that the present invention is not limited to such an arrangement. Specifically the individual reflectors 21 maybe actuated in any convenient fashion, provided alternate rows in a control area 20 are actuated in the same manner.

Figure 3E:
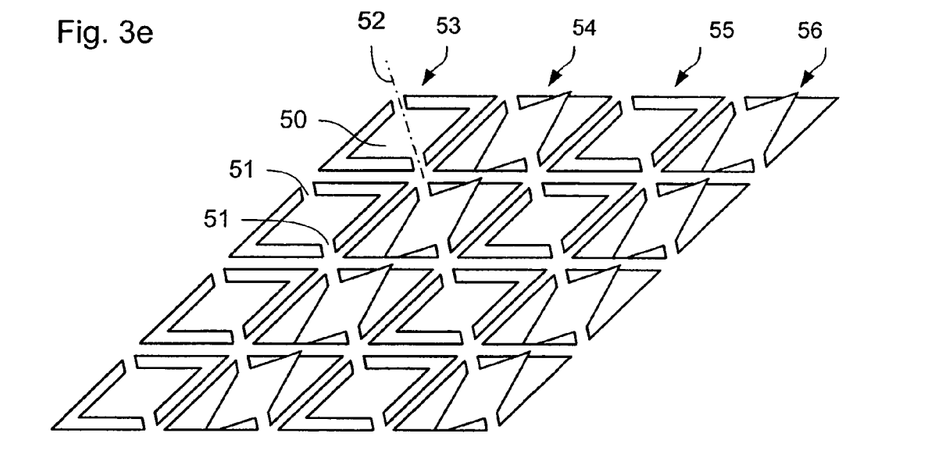

In one example, as shown in FIG. 3e, reflectors 50 are mounted by hinges 51 at opposite corners of reflectors 50. Accordingly, a tilt axis 52 that reflectors 50 rotate about when actuated passes through reflector 50 from corner to corner. Therefore, when using square reflectors, a tilt axis 52 of reflectors 50 is at 45° to rows 53,54,55,56 of reflectors 50 that are actuated in a common fashion.

Figure 3F:
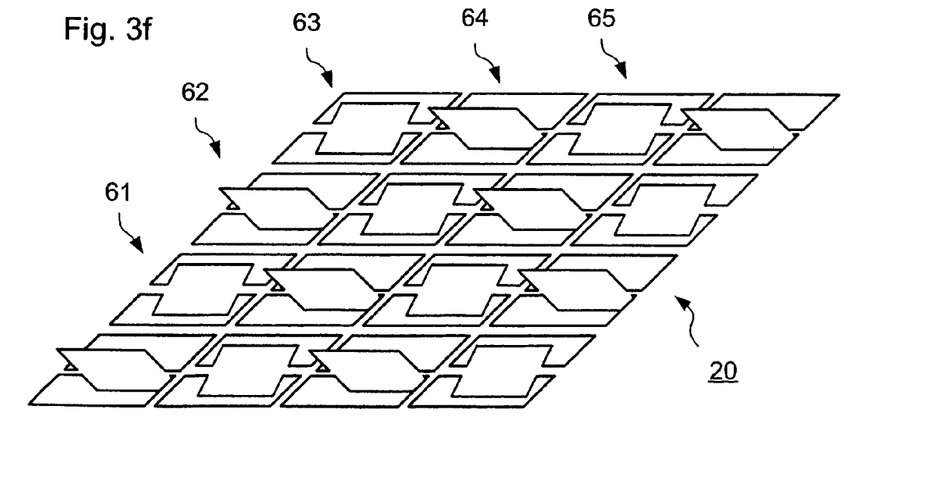

FIG. 3f shows a further arrangement, in which rows 61,62,63,64,65 of reflectors in control area 20, which are actuated in the same manner as just described, are at 45° to the tilt axes of the reflectors. In this case, the hinges are arranged at the midpoints of opposite sides the reflectors and the tilt axes of the reflectors are parallel to their other sides. However, within the rows of reflectors that are actuated in a common manner, adjacent reflectors abut each other corner to corner.

It is further to be appreciated that alternative hinge arrangements and/or shapes of reflectors may also be used. For example, triangular, rectangular, hexagonal, diamond shaped, or the like shaped reflectors may also be used. Likewise reflectors may be used in which one side of the reflector is attached to the support and the whole reflector bends or the side functions as a hinge (a so called "diving board" hinge arrangement).

In the above embodiments and examples, the systems utilize reflectors that are moved by tilting them about tilt axes.

In another embodiment, reflectors can be actuated to move in a direction perpendicular to the plane of the reflector, i.e., "piston reflectors." In this embodiment, a control area comprising rows of piston reflectors functions as a grating by setting alternate rows of piston reflectors to a first position and the remainder to a different position to form a phase grating. If using square piston reflectors, for example, a one dimensional grating can be formed if the commonly actuated rows of piston reflectors are arranged parallel to the sides of the reflectors.

In one example, the commonly actuated rows of piston reflectors may be at an angle of 45° to the sides of the reflectors, which can be an arrangement similar to that shown in FIG. 3f for tilting reflectors and commonly referred to as a "checkerboard" configuration. This provides a two dimensional grating with half the grating period of the one dimensional grating previously described.

It will be appreciated that applying a common control signal to a row of reflectors may not provide an identical actuation response from each of the reflectors in the row, which is in contrast to conventional arrays of reflectors in which each reflector is independently actuated. In such a conventional arrangements, the precise position of an individual reflector must be carefully controlled, which may require significant calibration control of each individual reflector. Furthermore, in such a conventional arrangement, if a reflector is damaged, such that it can no longer be actuated, there is no way to directly compensate for that pixel which may be, for example, permanently on or permanently off. Therefore, with such an arrangement, it may be necessary to provide a plurality of exposures for a given pattern in order to compensate for known damaged pixels.

In contrast, in one or more embodiments and/or examples of the present invention, a single damaged reflector may not have a significant affect on the overall performance of a single control area. Accordingly, the embodiments and/or examples of the array of individually controllable elements of the present invention is able to cope with a larger number of damaged elements than a conventional system.

Although the above description has referred to control area 20 being actuated between a first position and a second position, it will be appreciated that the present invention is not limited to merely providing binary control. In particular, the rows of reflectors may be set to any one of a plurality of common positions, thereby providing grayscale intensity control.

Furthermore, although the invention has been described in detail and is shown in the Figures with each control area 20 being comprised of four rows of fours reflectors, it will be appreciated that control area 20 may be different sizes. In one example, a minimum number of rows of reflectors to form a suitable grating is three. In another example, a minimum of four rows is used. In other examples, a control area of from six rows of six reflectors up to ten rows of ten reflectors, or larger, may be used. Furthermore, it will be appreciated that the number of rows and the number of reflectors within each row need not be the same.

Exemplary Control System for An Array of Programmable Elements

Figure 4:
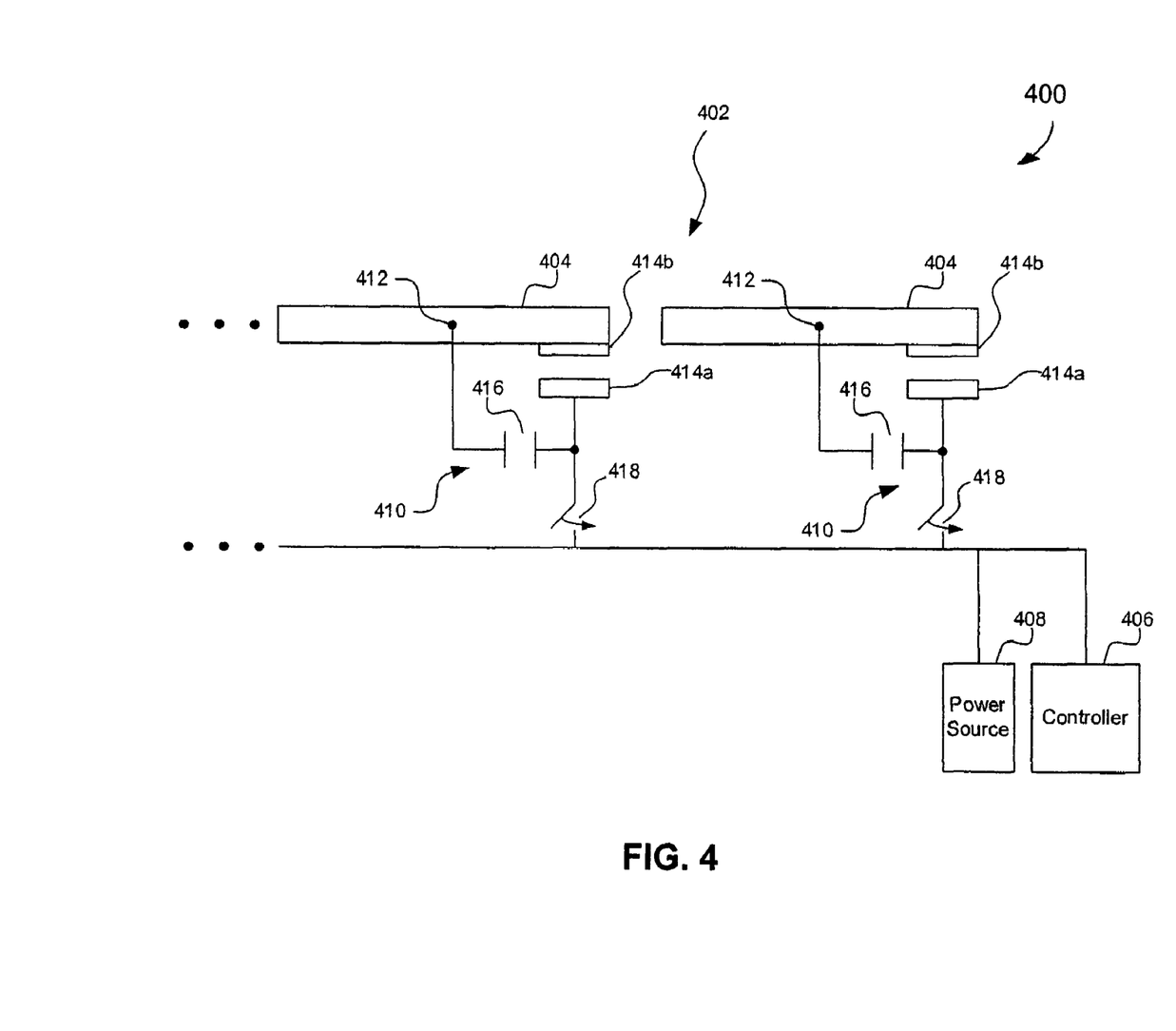
FIG. 4 shows a control system for an array of programmable elements, according to one embodiment of the present invention.

FIG. 4 shows a control system 400 for an array of programmable elements 402, according to one embodiment of the present invention. Although only two elements 404 are shown, it is to be appreciated array of programmable elements can have as many elements as desired of any shape and in any formation, some examples of which are described above. A controller 406 and power source 408 are coupled to an actuator 410 associated with each element 404.

Element 404 pivots around a pivot rod 412 under actuation of a potential created between contacts 414a and 414b via actuator 410, i.e., a capacitive actuator. Contacts 414a and pivot rods 412 are capacitively coupled via a capacitor 416.

In one example, energy flow through actuator 410 is controlled using a switch 418 coupled to controller 406 and power source 408. In this example, when controller 406 opens switch 418, no energy flows, while when controller 406 closes switch 418 energy is allowed to flow. When energy flows, a potential at contact 414a attracts contact 414b, and thus moves element 404 towards contact 414a around pivot rod 412. Switch 418 can be, but is not limited to, a transistor or the like, which opens and closes based on bias generated by controller 406.

Thus, as described in more detail above, depending on whether switch 418 is open or closed, light reflecting from element 404 is either directed towards or away from a substrate (now shown) to control patterning of the substrate.

It is to be appreciated that alternative actuators and control systems can also be used, for example, but not limited to, individual controllers for each element 404, distributed controllers, shared controlled for groups of elements 404, etc. All are contemplated within the scope of the present invention.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above described exemplary embodiments, but should be defined only in accordance with the following claims and their equivalents.

What is claimed is:

1. A lithographic apparatus, comprising:
an illumination system that supplies a beam of radiation;
an array of reflectors that pattern the beam, each reflector having an associated actuator that positions the reflector, and the array of reflectors having a plurality of control areas that each comprise a plurality of rows of the reflectors;
a controller that provides control signals to the control areas, such that, on the basis of said control signals, alternate rows of reflectors in each of the plurality of control areas are set to a first common position and the remaining rows of reflectors in the plurality of control areas are set to a second common position, wherein for any given control area, said control signals control said given control area, without controlling any single reflector in said given control area independently of remaining reflectors in said given control area, and said first and second common positions are designated by said control signals from among three or more possible positions that correspond to a sequence of gray states; and
a projection system that projects the patterned beam onto a target portion of a substrate.

2. The lithographic apparatus of claim 1, wherein each of the plurality of control areas comprise at least three adjacent rows of the reflectors.

3. The lithographic apparatus of claim 1, wherein each of the rows of the reflectors comprises at least three adjacent reflectors.

4. The lithographic apparatus of claim 1, wherein a first common control signal from the controller is provided to one of the control areas, causing the alternate rows of reflectors in said one of the control areas to be set to the first common position.

5. The lithographic apparatus of claim 4, wherein a second common control signal from the controller is provided to said one of the control areas, causing the remaining rows of the reflectors in the said one of the control areas to be set to the second position.

6. The lithographic apparatus of claim 1, wherein:
a common control signal from the controller is provided to the actuators associated with all of the reflectors in a first control area to set the first and second positions of the reflectors in said first control area;
the actuators associated with the reflectors in the alternate rows of the first control area actuate the reflectors in a first direction in response to the common control signal; and
the actuators associated with the remaining reflectors in the first control area actuate the remaining reflectors in a second direction in response to the common control signal.

7. The lithographic apparatus of claim 6, wherein:
the reflectors in the first control area rotate about respective tilt axes when actuated;
the respective tilt axes are mutually parallel; and
the first and second directions are opposite rotations about the tilt axes.

8. The lithographic apparatus of claim 1, wherein:
the reflectors rotate about respective tilt axes that are substantially parallel to a first direction; and
the plurality of rows of reflectors are arranged substantially perpendicular to the first direction.

9. The lithographic apparatus of claim 1, wherein:
the reflectors rotate about respective tilt axes that are substantially parallel to a first direction; and
the rows of reflectors are arranged substantially parallel to the first direction.

10. The lithographic apparatus of claim 1, wherein:
the reflectors rotate about respective tilt axes that are substantially parallel to a first direction; and
the rows of reflectors are arranged at substantially 45° to the first direction.

11. The lithographic apparatus of claim 1, wherein the actuators associated with the reflectors share a common component, such that the reflectors are actuated together.

12. The lithographic apparatus of claim 1, wherein:
each actuator comprises a capacitive actuator that generates a force between a conductor that moves with an associated reflector and a conductor on a base of the array of reflectors; and
the actuators associated with the reflectors in each row have a common conductor on the base.

13. An array of reflectors having one or more control areas, the array of reflectors modulating a beam of radiation in a lithographic apparatus, the lithographic apparatus comprising:
actuators that position respective reflectors in the array of reflectors; and
a controller that, in a first configuration, provides control signals to the actuators, such that alternate rows of the reflectors in each of the control areas are set to a first common position and remaining ones of the rows of the reflectors are set to a second common position, wherein for any given control area, said control signals control said given control area, without controlling any single reflector in said given control area independently of remaining reflectors in said given control area, and said first and second common positions are designated by said control signals from among three or more possible positions that correspond to a sequence of gray states.

14. The array of claim 13, wherein each of the control areas comprise at least three adjacent rows of reflectors.

15. The array according to claim 13, wherein the controller is switched to a second configuration in which it provides control signals to the actuators, such that each of the reflectors is independently set to a desired position.

16. A device manufacturing method, comprising:
(a) patterning a beam of radiation using an array of reflectors;
(b) providing one or more control areas within the array of reflectors, each respective reflector in the array of reflectors being positioned by an associated actuator;
(c) providing control signals to the actuators, such that alternate rows of the reflectors in each of the control areas are set to a first common position and remaining the rows of the reflectors are set to a second common position, wherein for any given control area, said control signals control said given control area, without controlling any single reflector in said given control area independently of remaining reflectors in said given control area, and said first and second common positions are designated by said control signals from among three or more possible positions that correspond to a sequence of gray states; and
(d) projecting the patterned beam onto a target portion of a substrate.

17. The method of claim 16, wherein step (b) comprises using at least three adjacent rows of the reflectors in each of the control areas.

* * * * *